United States Patent [19]
Yamamoto

[11] Patent Number: 5,340,773
[45] Date of Patent: Aug. 23, 1994

[54] METHOD OF FABRICATING A SEMICONDUCTOR DEVICE

[75] Inventor: Tomio Yamamoto, Tokyo, Japan

[73] Assignee: NEC Corporation, Japan

[21] Appl. No.: 960,789

[22] Filed: Oct. 14, 1992

[30] Foreign Application Priority Data

Oct. 16, 1991 [JP] Japan .................. 3-267413

[51] Int. Cl.$^5$ .................................. H01L 21/288
[52] U.S. Cl. .................... 437/230; 437/981; 437/246; 148/DIG. 105
[58] Field of Search ............. 437/230, 981, 245, 246; 148/105; 156/643

[56] References Cited

U.S. PATENT DOCUMENTS

| | | | |
|---|---|---|---|
| 4,330,343 | 5/1989 | Christou et al. | 437/230 |
| 4,798,650 | 1/1989 | Nakamura et al. | 156/643 |
| 4,919,748 | 4/1990 | Bredbenner et al. | 156/643 |
| 4,988,412 | 1/1991 | Liu et al. | 205/118 |
| 5,156,996 | 10/1992 | Miley | 437/182 |

*Primary Examiner*—Olik Chaudhuri
*Assistant Examiner*—C. Everhart
*Attorney, Agent, or Firm*—Laff, Whitesel, Conte & Saret

[57] ABSTRACT

A method of fabricating a semiconductor device in which first an aluminum film is etched using a photoresist pattern as a mask, and then the patterned aluminum film is used as a mask for plating to form a pattern of gold plating film. In so doing, if a wiring is formed using a plating process, the problems of deformity of the gold plating film due to degradation of a plating solution, short-circuits between the patterns due to cracks in the plating mask, and re-adhering of etched material when etching the electrical current paths used during the electroplating process, and the problem of sideways etching can be solved.

18 Claims, 3 Drawing Sheets

METHOD OF FABRICATING A SEMICONDUCTOR DEVICE

BACKGROUND OF THE INVENTION

1. Field of the Invention

This invention relates to a method of fabricating a semiconductor device, and in more particular to a method of forming wiring for connecting elements on a semiconductor device.

2. Description of the Prior Art

After elements such as transistors and capacitors have been formed on a semiconductor substrate, the elements are connected to each other by forming wiring, and generally aluminum has been used due to the fact that it is easy to process. However, recently, gold has been used in place of aluminum because of problems with reliability due to electromigration. With gold it is difficult to form patterns using etching and so a plating process as shown in FIGS. 1A to 1C is used.

First, after the elements have been formed on the semiconductor substrate 1, barrier films are formed on the substrate 1 using sputtering. Here a TiW (titanium. tungsten) film 2 and Au (gold) film 3 are formed. The surface of the semiconductor substrate 1 with these barrier films formed on it is normally an insulated surface. Next, a photoresist pattern 5 is formed everywhere except where the wiring is to be formed (see FIG. 1A). This photoresist pattern 5 is used as a mask and a gold plating film 6 is grown using an electroplating method. At this time, the sputtered TiW film 2 and Au film 3 are used as electrical current paths for the plating (see FIG. 1B). Finally, the photoresist 5 is removed chemically, and the gold plating film 6 is used as a mask and the sputtered Au film 3 and TiW film 2 are etched and removed by a dry process such as magnetron ion etching, or are etched and removed by a wet process using aqua regia or hydrogen peroxide (see FIG. 1C).

In this prior plating process, because the photoresist pattern is used as a mask during plating, part of the photoresist is dissolved in a plating solution. The quality of the plating solution is lowered by the dissolved photoresist, and deformities occur due to localized changes in the growing speed of the gold plating film, therefore it is necessary to increase the frequency of replacing the plating solution.

Also, positive type photoresist cracks easily in an alkaline plating solution and so the plating solution seeps into the cracks causing short-circuits to occur between the patterns.

Furthermore, it is easy for a forward taper to occur on the sides of the photoresist pattern, and so when the gold plating film is grown, it is easy for a backward taper to occur on the sides of the gold plating pattern. This becomes very evident from post baking performed before plating. Therefore, when the sputtered Au and sputtered TiW films are removed using the magnetron ion etching, the etched material adheres again in the backward tapered portion and is stripped away during post processing making it easy for short circuits to occur in the patterns.

When the sputtered Au and sputtered TiW films are removed using the wet process, since these sputtered films are used as electrical current paths for the plating, they can be removed only after gold plating has been performed, and so there is a problem during wet etching, in that sideways etching or undercutting occurs below the gold plating film.

SUMMARY OF THE INVENTION

An object of this invention is to provide a method of fabricating a semiconductor device which eliminates the problems of, occurrence of deformities in metal wiring due to degradation of a plating solution, occurrence of short circuits between patterns due to cracks in a plating mask, and re-adhering of etched material and occurrence of sideways etching or undercutting when etching the electrical current paths used during electroplating.

The aforementioned object is effectively accomplished by a method of fabricating a semiconductor device in which a wiring or wirings is formed on a semiconductor substrate using a plating process, comprising performing the plating process by using an aluminum film pattern as a mask.

DESCRIPTION OF THE PREFERRED EMBODIMENTS

In detail, the method of fabricating the semiconductor device of this invention comprises a process for forming an aluminum film on a semiconductor substrate on which a barrier film is formed, a process for forming a photoresist pattern on the aforementioned aluminum film, a process for patterning the aforementioned aluminum film using the aforementioned photoresist pattern as a mask, and a process for performing electrolytic plating using the aforementioned aluminum film pattern or patterned aluminum film as a mask to forming metallic wiring. In this case, for example, it is desired that the electroplating is performed using gold as a plating material, and the metallic wiring comprises gold wiring.

Next, a detailed description of this invention will be given with reference to the accompanying drawings.

Figure 2A:
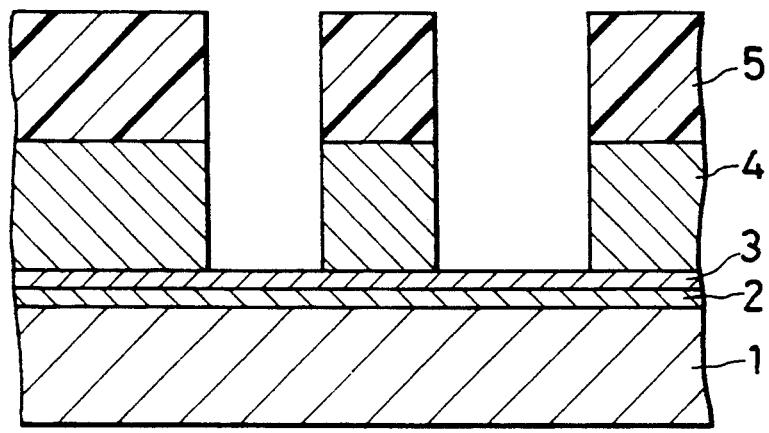
FIGS. 2A to 2C are partial cross sectional views showing the sequence of processes for describing a process of forming wiring by plating according to a first embodiment of this invention.
Figure 2B:
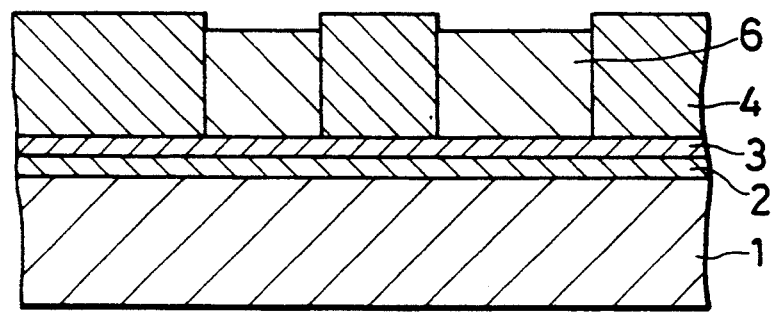
Figure 2C:
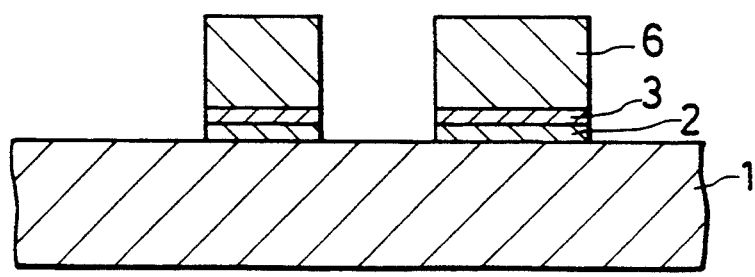

FIGS. 2A to 2C are partial cross-sectional views showing a wire plating process of a first embodiment of this invention. Transistors and capacitors are formed on a semiconductor substrate 1 and then insulating films, which include a field insulation film, are formed in order on the substrate surface, after which a TiW film 2 and an Au film 3, both having a thickness of 100 nm, are formed on top of the semiconductor substrate 1 using a sputtering method. Next, an aluminum film is deposited on the surface of the Au film 3 using a sputtering method so that it is approximately 20% thicker than a gold plating film 6 for wiring which will be formed in a later plating process. After this, a photoresist pattern 5 is formed using a photolithography process everywhere on the surface except where the gold plating film 6 is to be formed. Using this photoresist pattern 5 as a mask, the aluminum film is etched by a known dry process using $Cl_3$, $BCl_3$, or $O_2$ gas to form an aluminum film pattern 4. At this time, by selecting a suitable flow rate of Cl3 gas, the sides of the aluminum film pattern 4 are made to have a backward taper (see FIG. 2A).

Next, the photoresist pattern 5 is removed chemically. After this, the surface is lightly oxidized using an O2 ashing device or system. Next, the aluminum film pattern 4 is used as a mask and the films 2 and 3 are used as electrical current paths and the gold plating film 6 is grown on the surface using electroplating. At this time, because the thickness of the aluminum film pattern 4 was made to be approximately 20% more than a target thickness of the gold plating film 6, the film 6 cannot become thicker than the aluminum film pattern 4. Also, characteristics of the gold plating film make it difficult for it to grow over the aluminum film pattern 4, but the gold plating film is selectively grown over the sputtered gold. The aforementioned oxidation of the surface of the aluminum film pattern 4 makes this selectability even more noticeable (see FIG. 2B).

Finally, the aluminum film pattern 4 is removed by etching it away chemically using a phosphoric acid family etching agent, and the thus exposed portions of the sputtered Au film 3 and TiW film 2 are etched away by magnetron ion etching using the gold plating film 6 as a mask, forming gold plating wirings (see FIG. 2C).

In this embodiment of the invention, during the electroplating process, the aluminum film is used as a mask, therefore no organic material is included into the plating solution and there is very little degradation of the plating solution. Also, there is no cracking in the positive type photoresist.

Furthermore, because the sides of the aluminum film pattern 4 can be made to have a backward taper, the sides of the gold plating film 6 are formed with a forward taper, and so during the magnetron ion etching process, it is possible to prevent the etched material from re-adhering.

Figure 1A:
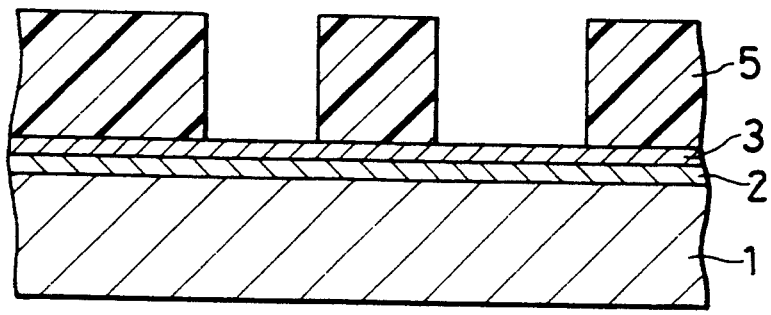
FIGS. 1A to 1C are partial cross sectional views showing the sequence of processes for describing a prior process of forming wiring by plating.
Figure 1B:
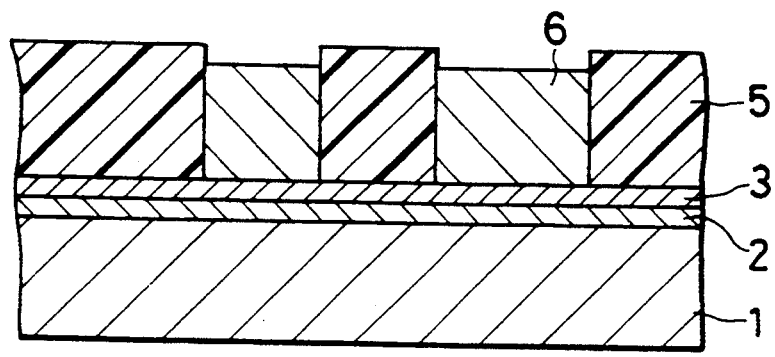
Figure 1C:
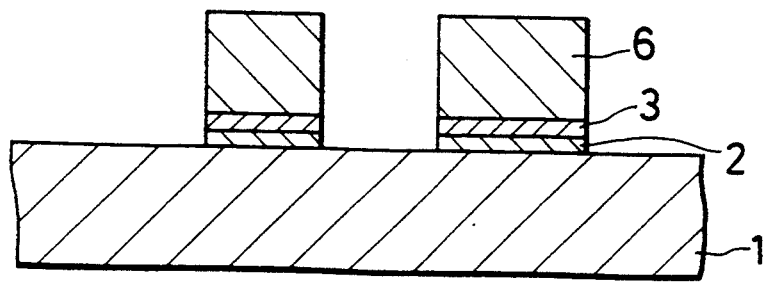

Also, when the photoresist pattern 5 is used as the mask as shown in FIG. 1B, pressure is applied to the photoresist pattern 5 as the gold plating film 6 is grown, and the upper surface or upper edges of the gold plating film 6 becomes round. However, when the aluminum film pattern 4 is used as the mask as shown in FIG. 2B, the upper surface of the gold plating film 6 becomes flat.

Figure 3A:
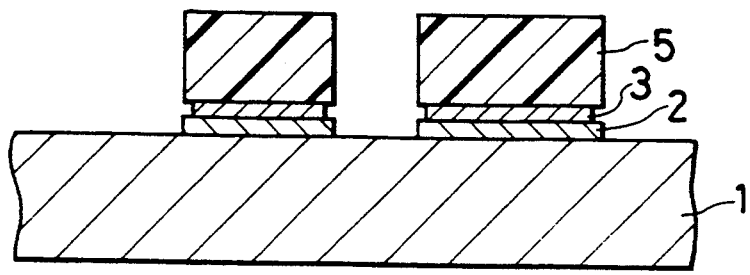
FIGS. 3A to 3D are partial cross-sectional views showing the sequence of processes for describing a process of forming wiring by plating according to a second embodiment of this invention.
Figure 3B:
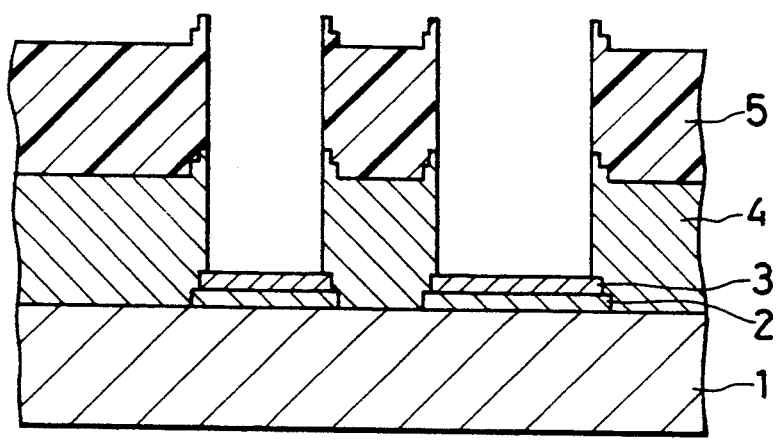
Figure 3C:
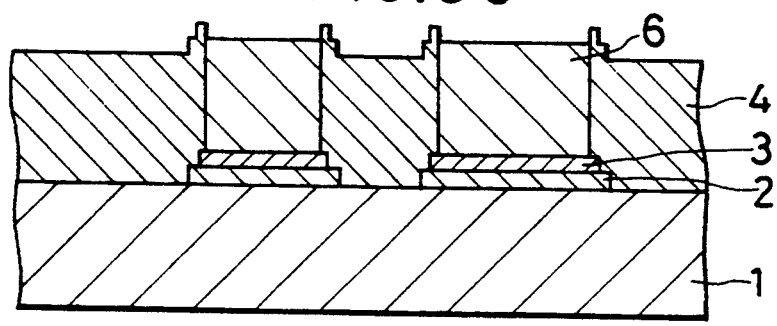
Figure 3D:
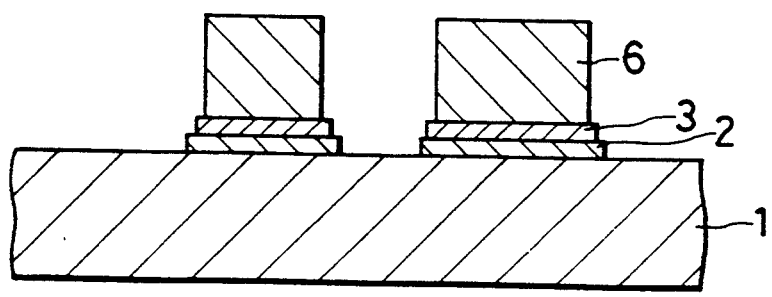

Referring now to FIGS. 3A to 3D which show a second embodiment of the plating process of this invention, as was done in the first embodiment of the invention, a TiW film 2 and an Au film 3 are formed in order on a semiconductor substrate 1 using a sputtering method. Thereafter, a photolithographic process is used to form a photoresist pattern 5 in the area where the gold plating film 6 will be formed in a later plating process, the photoresist pattern 5 being formed with a width which is about 0.2 μm wider on one side thereof than that of the plating gold film 6. Then, the photoresist pattern 5 is used as a mask and the sputtered Au film 3 is etched away using aqua regia, and the sputtered TiW film 2 is etched away using SF6 gas or CF4 gas (FIG. 3A). After this, a photoresist pattern 5, an aluminum film pattern 4 used as a mask, and a gold plating film 6 for wiring are formed and the aluminum film pattern 4 is etched away using the same method as in the first embodiment (FIGS. 3B to 3D).

In this second embodiment of the invention, the sputtered Au film 3 and sputtered TiW film 2 are etched away before the gold plating film 6 is deposited, thus making it easier to form the patterns. This is because during the electroplating process, the aluminum film pattern 4 is used as a mask and at the same time the aluminum film pattern 4 serves as the electric current path for plating. At this time, it is sufficient if the overlapping of the sputtered TiW film 2 and the sputtered Au film 3 with the aluminum film pattern 4 is about 0.2 μm on one side.

As was described above, this invention uses an aluminum film as a mask in place of the prior photoresist when forming wirings on a semiconductor substrate using a plating process, and in doing so effectively makes it possible to prevent deformities of gold plating film from occurring due to organic materials being included into the plating solution, and prevent short-circuits between the patterns from occurring due to cracks in the positive type photoresist, as well as effectively solves the problem of etched material re-adhered and the problem of sideways etching when etching the electrical current path used during electrolytic plating.

While this invention has been particularly described with reference to the preferred embodiments thereof, it will be understood by those skilled in the art that the foregoing and other changes in form and details may be made therein without departing from the spirit and scope of the invention.

What is claimed is:

1. A method of fabricating a semiconductor device in which wiring is formed on a semiconductor substrate using a plating process, including the step of forming an aluminum film pattern thicker than a metallic wiring to be formed on said semiconductor substrate, and using said aluminum film pattern as a mask.

2. The method of fabricating a semiconductor device as defined in claim 1 in which said plating process is performed by using gold as a plating material.

3. A method of fabricating a semiconductor device comprising the steps of:
   forming an aluminum film on a semiconductor substrate;
   forming a photoresist pattern on said aluminum film;
   patterning said aluminum film using said photoresist pattern as a mask to form an aluminum film pattern thicker than a metallic wiring to be formed on said semiconductor substrate; and
   performing electroplating using said aluminum film pattern as a mask to form metallic wiring.

4. The method of fabricating a semiconductor device as defined in claim 3 in which said electroplating is performed by using gold as a plating material and said metallic wiring is composed of gold.

5. A method of fabricating a semiconductor device comprising steps of:
   forming a barrier film on a semiconductor substrate;
   depositing thereon an aluminum film which is thicker than a metallic wiring which will be formed in a later step;
   forming a photoresist pattern on said aluminum film everywhere except where said metallic wiring will be formed later;
   forming an aluminum film pattern with backward tapered sides by dry etching said aluminum film using said photoresist pattern as a mask;
   removing said photoresist pattern;
   performing electroplating using said aluminum film pattern as a mask to form metallic wiring; and
   etching away said aluminum film pattern and then etching away an exposed barrier film using said metallic wiring as a mask.

6. The method of fabricating a semiconductor device as defined in claim 5 in which said barrier film consists of a TiW film and an Au film formed thereon.

7. The method of fabricating a semiconductor device as defined in claim 5 in which said aluminum film is deposited to a thickness approximately 20% more than that of said metallic wiring.

8. The method of fabricating a semiconductor device as defined in claim 5 in which $Cl_3$, $BCl_3$ or $O_2$ gas is used in said dry etching step of said aluminum film.

9. The method of fabricating a semiconductor device as defined in claim 5 in which the surface after said photoresist pattern has been removed is oxidized before performing said electroplating.

10. The method of fabricating a semiconductor device as defined in claim 5 in which said electroplating is performed by using gold as a plating material, and said metallic wiring is composed of gold.

11. A method of fabricating a semiconductor device comprising steps of:
    forming a barrier film on a semiconductor substrate;
    forming thereon a photoresist pattern in the area where metallic wiring will be formed in a later step and which is wider than that of said metallic wiring;
    etching away said barrier film using said photoresist pattern as a mask and removing said photoresist pattern;
    depositing an aluminum film on the resulting surface which is thicker than a metallic wiring which will be formed in a later step;
    forming another photoresist pattern on said aluminum film everywhere except where said metallic wiring will be formed later;
    forming an aluminum film pattern with backward tapered rides by dry etching said aluminum film using said photoresist pattern as a mask;
    removing said another photoresist pattern;
    performing electroplating using said aluminum film pattern as a mask to form said metallic wiring; and
    etching away said aluminum film.

12. The method of fabricating a semiconductor device as defined in claim 11 in which said barrier film consists of a TiW film and an Au film formed thereon.

13. The method of fabricating a semiconductor device as defined in claim 12 in which said Au film is etched away using aqua regia in a later step, and said TiW film is etched away using $SF_6$ or $CF_4$ gas in a later step.

14. The method of fabricating a semiconductor device as defined in claim 11 in which the width of said photoresist pattern formed on said barrier film is wider than that of said metallic wiring by approximately 2 μm on one side.

15. The method of fabricating a semiconductor device as defined in claim 11 in which the surface after said another photoresist pattern has been removed is oxidized before performing said electroplating.

16. The method of fabricating a semiconductor device as defined in claim 11 in which said electroplating is performed by using gold as a plating material, and said metallic wiring is composed of gold.

17. The method of claim 5 wherein the barrier film consists of a TiW film and an Au film formed thereon; said aluminum film is deposited to a thickness approximately 20% more than that of said metal wiring; $Cl_3$, $BCl_3$ or $O_2$ is used in said dry etching step of said aluminum film; the surface after said photoresist pattern has been removed is oxidized before performing said electroplating; said electroplating is gold electroplating and said metallic wiring is composed of gold.

18. The method of claim 11 wherein the barrier film consists of TiW film with an Au film formed thereon; the photoresist pattern formed on said barrier film is wider than that of said metallic wiring by approximately 2 μm on one side; said Au film is etched away with aqua regia and said TiW film is etched away using $SF_6$ or $CF_4$ gas; oxidizing the surface after said another photoresist pattern has been removed before electroplating; said electroplating is gold electroplating and said metallic wiring is composed of gold.

* * * * *